United States Patent
Kuno et al.

(10) Patent No.: US 12,230,526 B2
(45) Date of Patent: Feb. 18, 2025

(54) ELECTROSTATIC CHUCK HEATER

(71) Applicant: NGK INSULATORS, LTD., Nagoya (JP)

(72) Inventors: Tatsuya Kuno, Nagoya (JP); Hiroshi Takebayashi, Handa (JP); Kenichiro Aikawa, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 304 days.

(21) Appl. No.: 17/451,504

(22) Filed: Oct. 20, 2021

(65) Prior Publication Data

US 2022/0037188 A1 Feb. 3, 2022

Related U.S. Application Data

(63) Continuation of application No. PCT/JP2020/024573, filed on Jun. 23, 2020.

(30) Foreign Application Priority Data

Jun. 28, 2019 (JP) .................. 2019-121489

(51) Int. Cl.
  *H01L 21/683* (2006.01)
  *H01L 21/67* (2006.01)
  *H05B 3/28* (2006.01)

(52) U.S. Cl.
  CPC .... *H01L 21/6833* (2013.01); *H01L 21/67103* (2013.01); *H01L 21/67109* (2013.01); *H05B 3/283* (2013.01)

(58) Field of Classification Search
  CPC ........... H01L 21/6833; H01L 21/67103; H01L 21/67109; H01L 21/68757; H01L 21/6831;
  (Continued)

(56) References Cited

U.S. PATENT DOCUMENTS

2009/0178764 A1\* 7/2009 Kanno .............. H01L 21/67103
156/345.52
2013/0220989 A1 8/2013 Pease et al.
(Continued)

FOREIGN PATENT DOCUMENTS

JP 2004111289 A \* 4/2004
JP 2008277862 A \* 11/2008
(Continued)

OTHER PUBLICATIONS

English translation of the International Preliminary Report on Patentability (Chapter I) dated Jan. 6, 2022 (Application No. PCT/JP2020/024573).

(Continued)

*Primary Examiner* — Thienvu V Tran
*Assistant Examiner* — Sreeya Sreevatsa
(74) *Attorney, Agent, or Firm* — BURR PATENT LAW, PLLC

(57) ABSTRACT

An electrostatic chuck heater includes an electrostatic chuck including an electrostatic electrode embedded in a ceramic sintered body, a cooling member cooling the electrostatic chuck, and a heater layer disposed between the electrostatic chuck and the cooling member and including a plurality of metal layers embedded therein in multiple stages, the metal layers including resistance heating element layers. The heater layer includes a ceramic insulating layer with a thickness of 2 μm or more and 50 μm or less between the metal layers.

6 Claims, 2 Drawing Sheets

(58) Field of Classification Search
CPC ..... H01L 21/67098; H05B 3/283; H05B 3/02; H05B 3/06; H05B 3/22; H05B 3/748; H05B 1/0233; B23Q 3/15; H02N 13/00
USPC .......................................................... 361/233
See application file for complete search history.

(56) References Cited

U.S. PATENT DOCUMENTS

| | | | | |
|---|---|---|---|---|
| 2015/0116889 | A1* | 4/2015 | Yamasaki | H02N 13/00 |
| | | | | 427/446 |
| 2016/0198524 | A1* | 7/2016 | Pease | H01L 21/67103 |
| | | | | 219/451.1 |
| 2017/0133258 | A1* | 5/2017 | Miwa | H01L 21/6831 |
| 2017/0280509 | A1 | 9/2017 | Takebayashi | |
| 2020/0286718 | A1* | 9/2020 | Abukawa | H05B 3/283 |

FOREIGN PATENT DOCUMENTS

| | | | |
|---|---|---|---|
| JP | 2009067662 | A * | 4/2009 |
| JP | 2009-170509 | A | 7/2009 |
| JP | 2012119120 | A * | 6/2012 |
| JP | 2013-235879 | A | 11/2013 |
| JP | 2015-515713 | A | 5/2015 |
| KR | 10-2014-0130215 | A | 11/2014 |
| WO | 2015/198942 | A1 | 12/2015 |
| WO | 2017/029876 | A1 | 2/2017 |

OTHER PUBLICATIONS

Korean Office Action (with English translation) dated Jul. 17, 2023 (Application No. 10-2021-7033742).
International Search Report and Written Opinion (Application No. PCT/JP2020/024573) dated Sep. 29, 2020.

* cited by examiner

ELECTROSTATIC CHUCK HEATER

BACKGROUND OF THE INVENTION

1. Field of the Invention

The present invention relates to an electrostatic chuck heater.

2. Description of the Related Art

In conveyance, exposure, a film deposition process, such as CVD, washing, etching, and micromachining, such as dicing, for a semiconductor wafer, an electrostatic chuck heater for attracting and holding the wafer has been used so far. As an example of the electrostatic chuck heater, there is known, as illustrated in FIG. 3, an electrostatic chuck heater 110 in which an electrostatic chuck 120 including an electrostatic electrode 124 and a plurality of metal layers 126 (including a resistance heating element layer) embedded in a ceramic sintered body 122 is bonded to a cooling member 130 for cooling the electrostatic chuck 120 with an adhesive layer 150 interposed therebetween. In that type of electrostatic chuck heater, because of using ceramic green sheets before firing, a thickness of one green sheet needs to be increased to some extent in consideration of dimension collapse. This causes a problem that an overall thickness of the ceramic sintered body 122 increases. On the other hand, an electrostatic chuck heater 210 is also known, as disclosed in Patent Literature (PTL) 1, which includes, as illustrated in FIG. 4, an electrostatic chuck 220 including an electrostatic electrode 224 embedded in a ceramic sintered body 222, a cooling member 230 for cooling the electrostatic chuck 220, and a sheet heater 240 disposed between the electrostatic chuck 220 and the cooling member 230. In the sheet heater 240, a plurality of metal layers 242, including resistance heating element layers, are embedded inside a resin sheet 241 in multiple stages. The sheet heater 240 is bonded to each of the electrostatic chuck 220 and the cooling member 230 with an adhesive layer 250 interposed therebetween. A total thickness of the electrostatic chuck 220 and the sheet heater 240 in the electrostatic chuck heater 210 of FIG. 4 can be made thinner than a thickness of the ceramic sintered body 122 in FIG. 3.

CITATION LIST

Patent Literature

PTL 1: International Publication Pamphlet No. 2017/29876

SUMMARY OF THE INVENTION

However, because the sheet heater 240 disposed between the electrostatic chuck 220 and the cooling member 230 has a large heat resistance, there arises a problem that it is difficult to quickly cool the electrostatic chuck 220 when an external heat input, such as a plasma heat input, is applied to the wafer that is electrostatically attracted to the electrostatic chuck 220.

The present invention has been made with intent to solve the above-described problem, and a main object of the present invention is to improve an ability for coping with the external heat input.

An electrostatic chuck heater of the present invention includes: an electrostatic chuck including an electrostatic electrode embedded in a ceramic sintered body; a cooling member cooling the electrostatic chuck; and a heater layer disposed between the electrostatic chuck and the cooling member and including a plurality of metal layers embedded therein in multiple stages, the metal layers including resistance heating element layers, wherein the heater layer includes a ceramic insulating layer with a thickness of 2 µm or more and 50 µm or less between the metal layers.

In the above-described electrostatic chuck heater, the heater layer includes the ceramic insulating layer with the thickness of 2 µm or more and 50 µm or less between the metal layers. When the thickness of the ceramic insulating layer is in the above-mentioned numerical range, the dielectric strength usually demanded for the resistance heating element layer is satisfied. Furthermore, an overall thickness of the heater layer is reduced, and a heat capacity of the heater layer is also reduced. In addition, ceramic has a higher thermal conductivity than resin. As a result, a heat resistance of the heater layer disposed between the electrostatic chuck and the cooling member is reduced, and the electrostatic chuck can be quickly cooled when an external heat input, such as a plasma heat input, is applied to the wafer that is electrostatically attracted to the electrostatic chuck. Thus, an ability for coping with the external heat input is improved by the electrostatic chuck heater according to the present invention.

In the above-described electrostatic chuck heater, a withstand voltage per one ceramic insulating layer is preferably AC 200 V or higher. With that feature, the occurrence of a dielectric breakdown can be sufficiently prevented during use of the electrostatic chuck heater.

In the above-described electrostatic chuck heater, a porosity of the ceramic insulating layer is preferably 0.5% or less. With that feature, it is possible to increase withstand voltage performance per unit thickness, to reduce the thickness of the heater layer required to ensure the withstand voltage, and to further reduce the heat resistance.

In the above-described electrostatic chuck heater, the heater layer includes preferably three or more number, more preferably five or more number, of the ceramic insulating layers. With that feature, a multi-zone heater (a heater in which the electrostatic chuck is divided into a plurality of zones and a resistance heating element is disposed for each of the zones) can be easily designed.

In the above-described electrostatic chuck heater, the ceramic insulating layer may be an aerosol deposition (AD) film. AD is suitable for accurately forming a thin film of fine ceramic particles. In addition, according to the AD, because ceramic particles can be deposited to form a film based on an impact solidification phenomenon, there is no need of sintering the ceramic particles at a high temperature.

In the above-described electrostatic chuck heater, the metal layers may be each an AD film, a CVD film, a PVD film, or a plating film. The metal layer may be formed by printing, for example, but it is preferably formed by an AD method (including a plasma AD method), a CVD method, a PVD method, or a plating method. Those methods are suitable for accurately forming a thin film of fine metal particles. Moreover, those methods do not need to use a paste that is prepared by mixing metal particles with a resin component.

In the above-described electrostatic chuck heater, the metal layers may include jumper line layers in which jumper lines for supplying electric power to the resistance heating element layers are wired. Particularly, when one resistance heating element layer is divided into a plurality of zones and the resistance heating element is arranged for each of the zones, it is preferable that the jumper line layers be disposed.

DETAILED DESCRIPTION OF THE INVENTION

Figure 1:
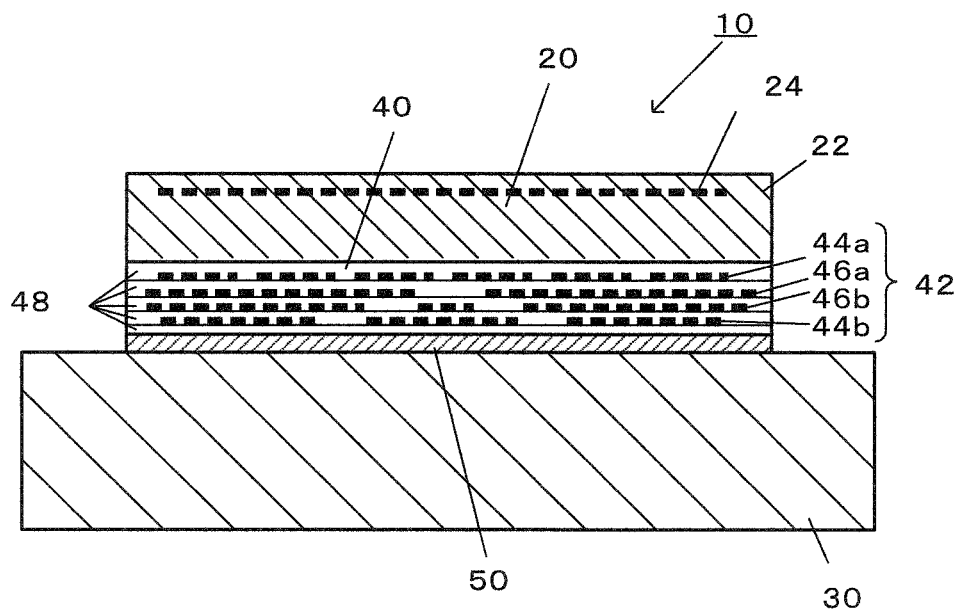
FIG. 1 is a vertical sectional view of an electrostatic chuck heater according to an embodiment.

A preferred embodiment of the present invention will be described below with reference to the drawing. FIG. 1 is a vertical sectional view of an electrostatic chuck heater according to the embodiment.

As illustrated in FIG. 1, an electrostatic chuck heater 10 includes an electrostatic chuck 20, a cooling member 30, and a heater layer 40. In the electrostatic chuck 20, an electrostatic electrode 24 is embedded in a ceramic sintered body 22 in the form of a disk. When a voltage is applied to the electrostatic electrode 24, the electrostatic electrode 24 electrostatically attracts a wafer (not illustrated) placed on an upper surface of the electrostatic chuck 20. The cooling member 30 is a metal-made member including a coolant path (not illustrated) formed therein and cools the electrostatic chuck 20. The heater layer 40 is disposed between the electrostatic chuck 20 and the cooling member 30 and includes a plurality of metal layers 42 embedded therein in multiple stages, the metal layers including resistance heating element layers 44a and 44b and jumper line layers 46a and 46b. The heater layer 40 is formed directly on a surface of the electrostatic chuck 20 on an opposite side to a wafer attraction surface thereof and is bonded to the cooling member 30 with an adhesive layer 50 interposed therebetween.

The heater layer 40 includes a ceramic insulating layer 48 with a thickness of 2 µm or more and 50 µm or less between the metal layers 42. The ceramic insulating layer 48 is preferably an AD film formed by an AD method using ceramic particles. The AD film has higher insulation than a thermally sprayed film and can be formed in a smaller thickness. The metal layers 42 are each preferably an AD film formed by the AD method using metal particles, or a film formed by a CVD method, a PVD method, or a plating method. The metal layers 42 include the upper resistance heating element layer 44a, the upper jumper line layer 46a, the lower jumper line layer 46b, and the lower resistance heating element layer 44b. The upper resistance heating element layer 44a is divided into many zones, and a resistance heating element is wired for each of the zones. The resistance heating element is wired to extend over the entirety of the zone in a one-stroke pattern from one end to the other end. The lower resistance heating element layer 44b is divided into a smaller number of zones than the upper resistance heating element layer, and a resistance heating element is wired for each of the zones. Each of the upper and lower jumper line layers 46a and 46b includes a plurality of jumper lines. The jumper lines supply electric power from a heater power supply to the resistance heating elements that are included in the upper and lower resistance heating element layers 44a and 44b.

In the above-described electrostatic chuck heater 10 according to this embodiment, the heater layer 40 includes the ceramic insulating layer 48 with the thickness of 2 µm or more and 50 µm or less between the metal layers 42. When the thickness of the ceramic insulating layer 48 is in the above-mentioned numerical range, the dielectric strength usually demanded for each of the resistance heating element layers 44a and 44b is satisfied. Furthermore, an overall thickness of the heater layer 40 is reduced, and a heat capacity of the heater layer 40 is also reduced. In addition, ceramic has a higher thermal conductivity than resin. As a result, a heat resistance of the heater layer 40 disposed between the electrostatic chuck 20 and the cooling member 30 is reduced, and the electrostatic chuck 20 can be quickly cooled when an external heat input, such as a plasma heat input, is applied to the wafer that is electrostatically attracted to the electrostatic chuck 20. Thus, an ability for coping with the external heat input is improved by the electrostatic chuck heater 10 according to this embodiment.

A withstand voltage (dielectric strength) per one ceramic insulating layer 48 is preferably AC 200 V or higher. Under such a condition, the occurrence of a dielectric breakdown can be sufficiently prevented during use of the electrostatic chuck heater 10.

Furthermore, a porosity of the ceramic insulating layer 48 is preferably 0.5% or less. Under such a condition, it is possible to increase withstand voltage performance per unit thickness, to reduce the thickness of the heater layer required to ensure the withstand voltage, and to further reduce the heat resistance.

The heater layer 40 includes preferably three or more number, more preferably five or more number, of the ceramic insulating layers 48. In such a case, a multi-zone heater can be easily designed.

The ceramic insulating layer 48 is preferably the AD film. AD is suitable for accurately forming a thin film of fine ceramic particles. In addition, according to the AD, because ceramic particles can be deposited to form a film based on an impact solidification phenomenon, there is no need of sintering the ceramic particles at a high temperature.

Moreover, the metal layers 42 include the jumper line layers 46a and 46b in which the jumper lines for supplying electric power to the resistance heating element layers 44a and 44b are wired. Particularly, when one resistance heating element layer is divided into a plurality of zones and the resistance heating element is arranged for each of the zones, it is preferable that the jumper line layers be disposed.

As a matter of course, the present invention is in no way limited to the above-described embodiment, and the present invention can be implemented in various embodiments insofar as falling within the technical scope of the present invention.

EXAMPLES

Experimental Examples 1 to 6

Figure 2:
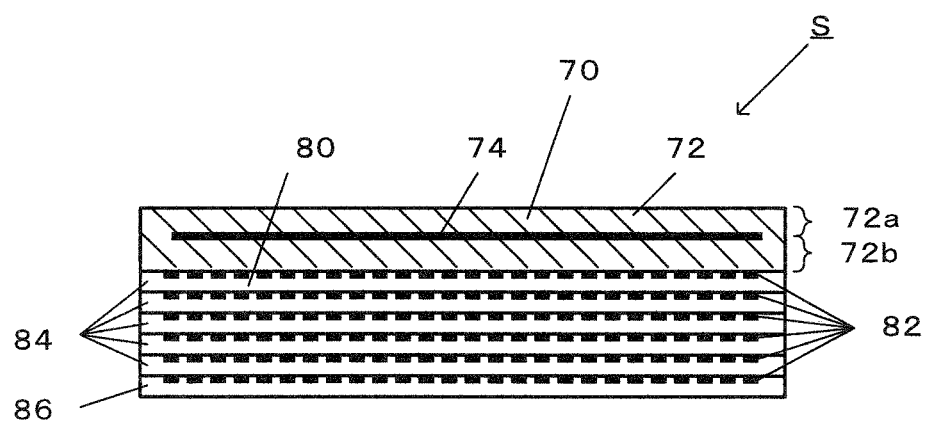
FIG. 2 is a vertical sectional view of a trial sample fabricated in experimental example.
Figure 3:
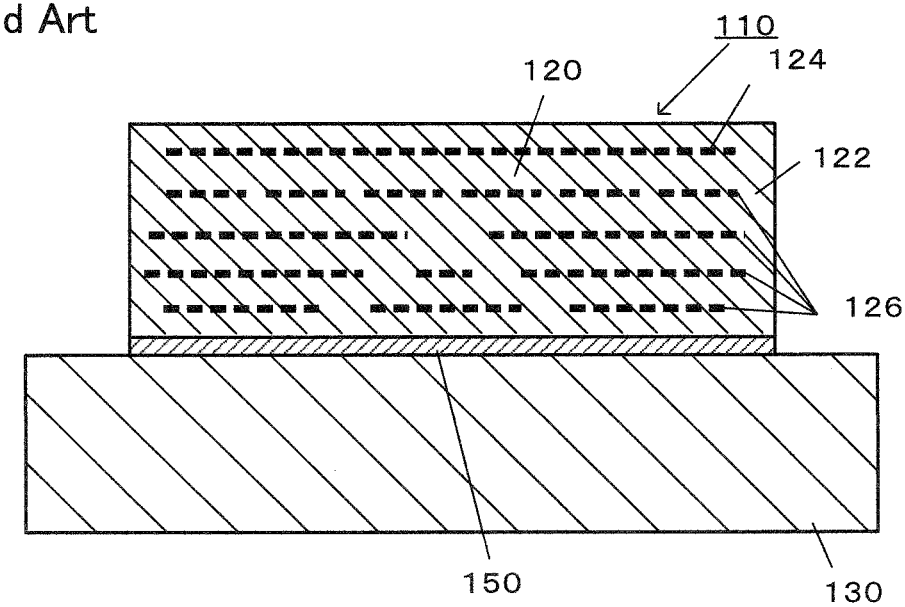
FIG. 3 is a vertical sectional view of an electrostatic chuck heater of related art.
Figure 4:
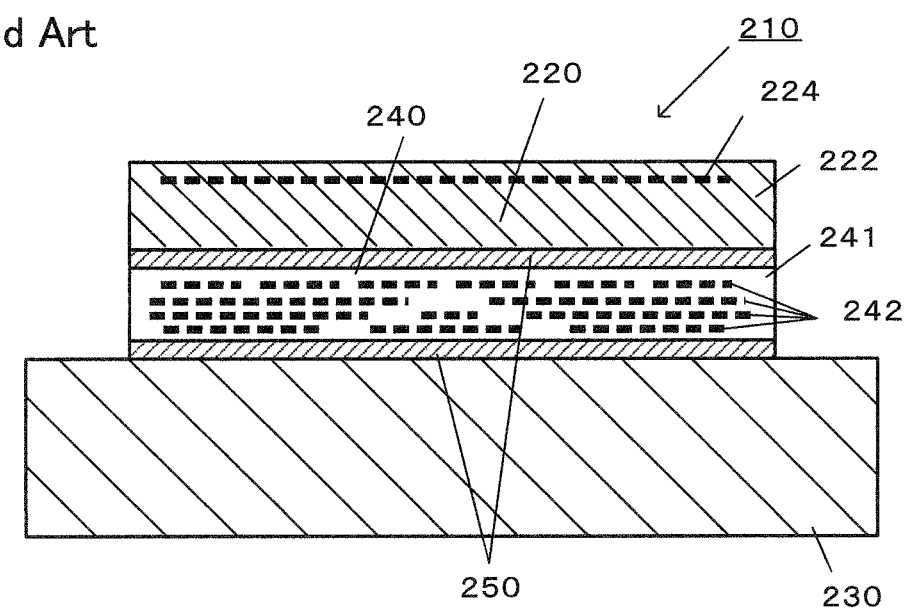
FIG. 4 is a vertical sectional view of another electrostatic chuck heater of related art.

As illustrated in FIG. 2, a sample S was fabricated in the form of a laminate of an electrostatic chuck 70 and a heater layer 80. The electrostatic chuck 70 had a structure that an electrostatic electrode 74 was embedded in an alumina ceramic sintered body 72 with a diameter φ0 of 300 mm. Assuming the electrostatic electrode 74 in the alumina ceramic sintered body 72 to be a boundary, an upper layer is called a dielectric layer 72a, and a lower layer is called an insulating layer 72b. A thickness of the dielectric layer 72a was set to 0.4 [mm], and a thickness of the insulating layer 72b was set to 0.5 [mm]. The heater layer 80 had a structure including six metal layers 82 formed therein. An interlayer insulating film 84 made of alumina ceramic was disposed between the metal layers 82, and a rear-side insulating film 86 made of alumina ceramic was disposed on a rear surface of the lowermost metal layer 82.

In each of experimental examples 1 to 4, the electrostatic chuck 70 was first fabricated. Then, after forming one metal layer 82 on a rear surface of the electrostatic chuck 70, one insulating film (interlayer insulating film 84) was formed to cover the one metal layer 82 by the AD method. Then, the above-mentioned work process of forming one metal layer 82 on a rear surface of the insulating film and thereafter forming one insulating film to cover the one metal layer 82 by the AD method was repeated, whereby the sample S was fabricated. The last formed insulating film was the rear-side insulating film 86. In experimental example 5, a sample S was fabricated in a similar manner to that in experimental examples 1 to 4 except for using a thermal spraying method instead of the AD method. In experimental example 6, a sample S was fabricated by repeating a work process of previously fabricating a plurality of tape cast films, forming one metal layer on the rear surface of the electrostatic chuck 70 and thereafter laminating one tape cast film on the one metal layer, further forming another metal layer on a rear surface of the one tape cast film and thereafter laminating another tape cast film to cover the other metal layer, and finally sintering the entirety of an obtained laminate.

For each of experimental examples, Table 1 lists the thickness of the dielectric layer 72a, the thickness of the insulating layer 72b, the total number of the metal layers 82, information about the interlayer insulating film 84, the thickness of the rear-side insulating film 86, and information about the sample S. The information about the interlayer insulating film 84 contains the material, the number of layers, the manufacturing method, the thickness, the withstand voltage, and the total thickness. The withstand voltage was measured by applying an AC potential difference between both sides of the interlayer insulating film 84. The information about the sample S contains the total thickness, the heat resistance (heat removal performance), and the time (theoretical value) required to raise temperature through 50° C. with supply of 1 kW.

Table 1

TABLE 1

| | | Experimental example 1 | Experimental example 2 | Experimental example 3 | Experimental example 4 | Experimental example 5 | Experimental example 6 |
|---|---|---|---|---|---|---|---|
| Thickness of dielectric layer [mm] | | | | | 0.4 | | |
| Thickness of insulating layer [mm] | | | | | 0.5 | | |
| Total number of metal layer [layer] | | | | | 6 | | |
| Interlayer insulating film | Material | | | | Alumina | | |
| | Number of layer [layer] | | | | 5 | | |
| | Manufacturing method | AD | AD | AD | AD | Thermally sprayed | Tape casting → Firing (bulk) |
| | Thickness [μm/layer] | 2.0 | 50 | 1.5 | 60 | 50 | 150 |
| | Withstand voltage [V/layer] | ≥AC200V | ≥AC200V | AC140V | ≥AC200V | ≥AC200V | ≥AC200V |
| | Total thickness [mm] | 0.01 | 0.25 | 0.0075 | 0.3 | 0.25 | 0.75 |
| Rear-side insulating film | Thickness [mm] | 0.05 | 0.05 | 0.05 | 0.05 | 0.2 | 0.5 |
| Entire sample (Φ300) | Total thickness [mm] | 0.96 | 1.20 | 0.96 | 1.25 | 1.35 | 2.15 |
| | Heat resistance (heat removal performance) [K/kW] | 0.4 | 0.5 | 0.4 | 0.5 | 0.8 | 0.9 |
| | Time required to raise temperature through 50° C. with supply of 1 kW (theoretical value) [sec] | 10.6 | 13.2 | 10.6 | 13.8 | 14.9 | 23.7 |
| Evaluation result | | Good | Good | Insulation failure | Cracking occurred | Good | Failure in rising temperature |
| Total thickness of heater layer [mm] (= Sum of total thickness of interlayer insulating film + Thickness of rear-side insulating film | | 0.06 | 0.3 | 0.0575 | 0.35 | 0.45 | 1.25 |
| Inventive (Inv.) or Comparative (Comp.) Example | | Inv. | Inv. | Comp. | Comp. | Comp. | Comp. |

In experimental examples 1 and 2 in which the thickness of the interlayer insulating film 84 (AD film) was 2 μm and 50 μm, respectively, the withstand voltage (AC 200 V or higher) usually demanded per one layer was satisfied. Furthermore, since the total thickness (the sum of the total thickness of the interlayer insulating films 84 and the rear-side insulating film 86) of the heater layer 80 was as thin as 0.3 mm or less, the heat capacity and the heat resistance of the heater layer 80 were reduced, and the time required to raise temperature through 50° C. with supply of 1 kW was shortened. On the other hand, in experimental example 3 in which the thickness of the interlayer insulating film 84 (AD film) was 1.5 μm, the withstand voltage usually demanded per one layer was not satisfied. In experimental example 4 in which the thickness of the interlayer insulating film 84 (AD film) was 60 μm, cracking occurred. The cracking is considered as being caused by an increase in internal stress within the AD film. From the above discussion, it is understood that the thickness of the interlayer insulating film 84 is preferably 2 μm or more and 50 μm or less.

In experimental example 5 in which the thickness of the interlayer insulating film 84 (thermally sprayed film) was 50 μm, the withstand voltage (AC 200 V or higher) usually demanded per one layer was satisfied. Since the total thickness of the heater layer 80 was as thin as 0.5 mm or less, the heat capacity and the heat resistance of the heater layer 80 were relatively small, and the time required to raise temperature through 50° C. with supply of 1 kW was relatively short. However, that time was longer than in the case of using the AD film. This is considered as being attributable to the fact that the porosity of the thermally sprayed film was several % and was higher than the porosity (0.5% or less) of the AD film.

In experimental example 6 in which the film obtained through the steps of tape casting and firing was used as the interlayer insulating film 84, the withstand voltage (AC 200 V or higher) usually demanded per one layer was satisfied. However, since the total thickness of the heater layer 80 was as thick as 1.25 mm, the heat capacity and the heat resistance of the heater layer 80 were increased, and the time required to raise temperature through 50° C. with supply of 1 kW was prolonged. Although not indicated in Table 1, in the case of using powder molding instead of the tape casting, the total thickness of the heater layer 80 was further increased, namely 3 mm, and the time required to raise temperature through 50° C. with supply of 1 kW exceeded 40 sec. In a manufacturing method using the tape casting or the powder molding, because a position of the metal layer embedded inside the ceramic varies due to firing distortion, the thickness of the interlayer insulating film 84 needs to be increased in comparison with the case of manufacturing the heater layer by the AD method or the thermally spraying method. Thus, the heat capacity and the heat resistance are increased.

Experimental examples 1, 2 and 5 correspond to Examples of the present invention, and experimental examples 3, 4 and 6 correspond to comparative examples. As a matter of course, those examples should not be construed as limiting the scope of the present invention.

The present application claims priority from Japanese Patent Application No. 2019-121489 filed Jun. 28, 2019, the entire contents of which are incorporated herein by reference.

What is claimed is:

1. An electrostatic chuck heater comprising:
an electrostatic chuck including an electrostatic electrode embedded in a ceramic sintered body comprising alumina including a dielectric layer and an insulating layer;
a cooling member cooling the electrostatic chuck; and
a heater layer disposed between the electrostatic chuck and the cooling member and including six metal layers embedded therein in multiple stages, the six metal layers including resistance heating element layers,
wherein the heater layer includes five ceramic insulating layers surrounding the six metal layers with a thickness of each ceramic insulating layer being 2 μm or more and 50 μm or less between each pair of metal layers, and a rear-side ceramic insulating layer with a thickness of about 0.05 mm between the sixth metal layer and the cooling member;
wherein each ceramic insulating layer is an aerosol deposition film or a thermally sprayed film comprising alumina;
wherein the total thickness of the heater layer (sum of thicknesses for the five ceramic insulating layers and the rear-side ceramic insulating layer) is between 0.06 mm and 0.45 mm;
wherein a withstand voltage per one ceramic insulating layer is AC 200 V or higher;
wherein the heater layer provides a heat resistance (heat removal performance) of between 0.4 and 0.8 K/kW to the electrostatic chuck heater.

2. The electrostatic chuck heater according to claim 1, wherein a porosity of each ceramic insulating layer is 0.5% or less.

3. The electrostatic chuck heater according to claim 1, wherein each ceramic insulating layer is an aerosol deposition film.

4. The electrostatic chuck heater according to claim 1, wherein the six metal layers are aerosol deposition films.

5. The electrostatic chuck heater according to claim 1, wherein the six metal layers include jumper line layers in which jumper lines for supplying electric power to the resistance heating element layers are wired.

6. The electrostatic chuck heater according to claim 1, wherein the electrostatic chuck heater exhibits no cracking in the heater layer during operation.

* * * * *